United States Patent
Sugimura et al.

(10) Patent No.: US 10,056,555 B2
(45) Date of Patent: Aug. 21, 2018

(54) PHOTOELECTRIC CONVERSION ELEMENT AND METHOD FOR MANUFACTURING THE SAME

(71) Applicant: Sharp Kabushiki Kaisha, Osaka (JP)

(72) Inventors: Hiroshi Sugimura, Osaka (JP); Kiyoto Motoyama, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 15/019,484

(22) Filed: Feb. 9, 2016

(65) Prior Publication Data

US 2016/0365525 A1 Dec. 15, 2016

(30) Foreign Application Priority Data

Jun. 12, 2015 (JP) ................................. 2015-118991

(51) Int. Cl.
*H01L 51/42* (2006.01)
*H01L 51/00* (2006.01)

(52) U.S. Cl.
CPC ........ *H01L 51/005* (2013.01); *H01L 51/4226* (2013.01); *H01L 51/0007* (2013.01);
(Continued)

(58) Field of Classification Search
CPC .... H01G 9/20; H01G 9/2004; H01L 51/4213; H01L 51/4253; H01L 51/424
See application file for complete search history.

(56) References Cited

U.S. PATENT DOCUMENTS 5,192,633 A * 3/1993 Iwasaki .................. G03G 5/047
430/58.45
5,677,094 A * 10/1997 Umeda .................. G03G 5/047
430/58.05
(Continued)

FOREIGN PATENT DOCUMENTS

WO WO2014132076 * 9/2014 ......... H01L 51/4226
WO WO 2015/016107 A1 2/2015

OTHER PUBLICATIONS

Kojima et al., "Organometal Halide Perovskites as Visible-Light Sensitizers for Photovoltaic Cells", J. Am. Chem. Soc. 2009, 131, pp. 6050-6051.
Lee et al., "Efficient Hybrid Solar Cells Based on Meso-Superstructured Organometal Halide Perovskites" Science, vol. 338, Nov. 2, 2012, pp. 643-647.
(Continued)

*Primary Examiner* — Bethany L Martin
(74) *Attorney, Agent, or Firm* — Renner, Otto, Boisselle & Sklar, LLP

(57) ABSTRACT

The purpose of the present invention is to provide an easy-to-manufacture organic-inorganic hybrid photoelectric conversion element having high photoelectric conversion efficiency and excellent durability. A photoelectric conversion element 1 further comprises a closely packed titanium oxide layer 4, a porous titanium oxide layer 5, an organic-inorganic hybrid crystal layer 6, and a hole transport layer 7 between a first conductive layer 3 and a second conductive
(Continued)

layer 8, wherein the hole transport layer 7 comprises a compound with the following structure (I):

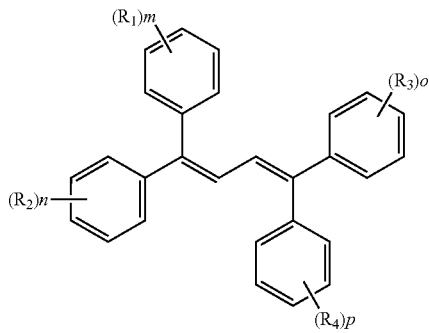

where $R_1$ to $R_4$ are each the same or different and represent hydrogen atom, substituted or unsubstituted alkyl group, substituted or unsubstituted alkylamino group, substituted or unsubstituted arylamino group, or substituted or unsubstituted alkoxy group, provided that a case in which all of the $R_1$ to $R_4$ are hydrogen atom is excluded; and m, n, o, and p are each the same or different and represent an integer of 1 to 5, provided that when any of the m, n, o, and p is an integer of 2 or more, the corresponding R groups may each be the same or different.

10 Claims, 1 Drawing Sheet

(52) U.S. Cl.
CPC ......... *H01L 51/0077* (2013.01); *Y02E 10/549* (2013.01); *Y02P 70/521* (2015.11)

(56) References Cited

U.S. PATENT DOCUMENTS

| | | | |
|---|---|---|---|
| 2007/0141505 A1* | 6/2007 | Kihara | G03G 5/047 430/134 |
| 2016/0013434 A1* | 1/2016 | Snaith | H01L 51/4226 136/252 |

OTHER PUBLICATIONS

Nguyen et al., "Enhancing the Hole-Conductivity of Spiro-OMeTAD without Oxygen or Lithium Salts by Using Spiro (TFSI)$_2$ in Perovskite and Dye-Sensitized Solar Cells", Journal of the American Chemical Society, 2014, 136, pp. 10996-11001.

Lv et al., "Mesoscopic TiO$_2$/CH$_3$NH$_3$PbI$_3$ perovskite solar cells with new hole-transporting materials containing butadiene derivatives", The Royal Society of Chemistry, 2014, 50, pp. 6931-6934.

* cited by examiner

[Fig.1]
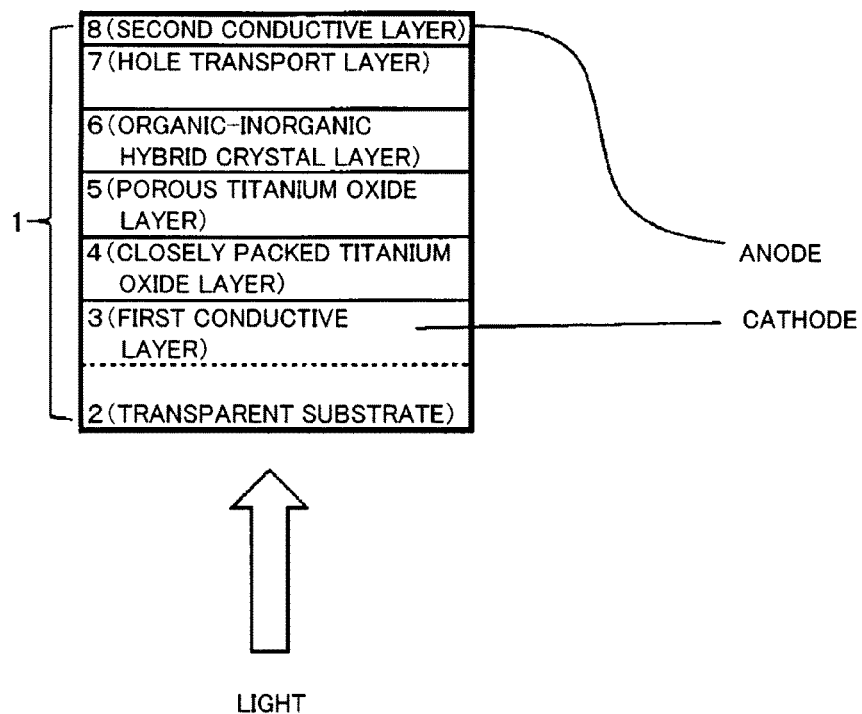
LIGHT
[Fig.2]
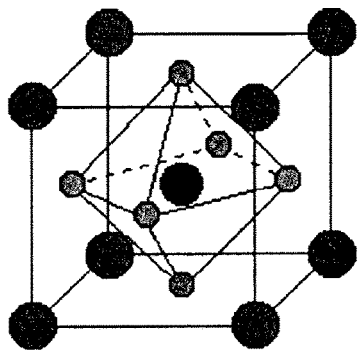

PHOTOELECTRIC CONVERSION ELEMENT AND METHOD FOR MANUFACTURING THE SAME

BACKGROUND OF THE INVENTION

The present invention relates to a photoelectric conversion element and a method for manufacturing the photoelectric conversion element. The present invention relates more specifically to an easy-to-manufacture organic-inorganic hybrid photoelectric conversion element having high photoelectric conversion efficiency and excellent durability.

Photoelectric conversion elements have been used for various optical sensors, copiers, solar cells, etc. The solar cells, in particular, are representative examples which utilize renewable energy and are becoming widely available. Examples of the available solar cells include a silicon-based solar cell, a CIGS-based solar cell, and a CdTe-based solar cell.

Meanwhile, studies are being conducted in which an organic material is applied to a photoelectric conversion material as an alternative for an inorganic material used in the above solar cells. Development of an organic thin-film solar cell and a dye-sensitized solar cell is in progress. Such solar cells can be manufactured using a coating process without a vacuum process. This may markedly reduce manufacturing cost. Thus, such solar cells should be a next-generation solar cell.

Unfortunately, the current organic thin-film solar cell and dye-sensitized solar cell have insufficient photoelectric conversion efficiency and low durability when compared with the above solar cells using an inorganic material.

Recently, a solar cell has been disclosed that uses, as a photoelectric conversion material, a lead complex with a perovskite crystal structure and an electrolytic solution (Non-Patent Document 1).

Further, the electrolytic solution used in the solar cell disclosed in Non-Patent Document 1 has been replaced by 2,2',7,7'-tetrakis(N,N-dimethoxyphenylamine)-9,9'-spirobifluorene (hereinafter, referred to as "spiro-OMeTAD"), a solid organic hole transport material. It has been found that the conversion efficiency exceeds 10% (Non-Patent Document 2).

This all-solid solar cell, what is called an organic-inorganic hybrid solar cell, using a perovskite-type crystal as a photoelectric conversion material has since then been developed rapidly. The conversion efficiency exceeds 20%. Most organic-inorganic hybrid solar cells reported use, as a hole transport material, spiro-OMeTAD with the following structure:

[Chem. 1]

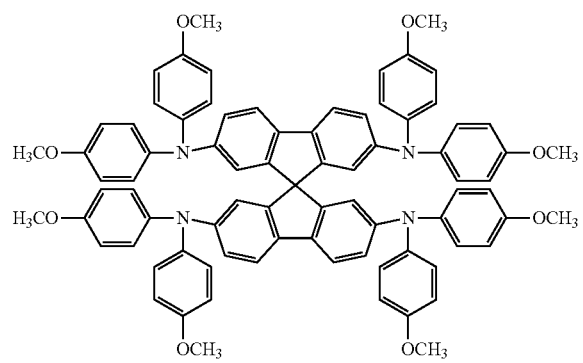

Meanwhile, inorganic materials have been applied to a hole transport layer of the organic-inorganic hybrid solar cell in some studies. Specifically, cuprous thiocyanate was employed as the hole transport material. This material, however, is toxic and is thus unsuitable as a material used for the outermost layer.

Patent Document 1: PCT International Publication No. WO2015/016107A1
Non-Patent Document 1: J. Am. Chem. Soc., 131, 6050 (2009)
Non-Patent Document 2: Science, 338, 643 (2012)
Non-Patent Document 3: J. Am. Chem. Soc. 2014, 136, 10996
Non-Patent Document 4: Chem. Commun., 2014, 50, 6931-6934

SUMMARY OF THE INVENTION

In view of the above, the organic-inorganic hybrid photoelectric conversion element is promising. However, it is difficult to synthesize the hole transport material spiro-OMeTAD used therein. Besides, the material is very expensive. Hence, this casts a problem when the area of the photoelectric conversion element is enlarged to produce a solar cell.

In addition, this spiro-OMeTAD exhibits low electron transport capability under a neutral condition and is a material with a characteristic in which the electron transport capability is not exerted until the material becomes oxidized. In order to use the material in practice, an oxidizer should be further added to coating liquid containing spiro-OMeTAD. Alternatively, the coating liquid should be left in the air for one day and be thus oxidized for usage. Unfortunately, the material is difficult to handle during manufacture and control of its photoelectric conversion properties after manufacture is also difficult (Non-Patent Document 3).

Meanwhile, as the hole transport material, a triarylamine-based compound and a butadiene-based compound, in addition to a fluorene-based compound, were used. To date, however, no material has been found to excel this spiro-OMeTAD (Patent Document 1 and Non-Patent Document 4).

Here, the purpose of the present invention is to solve the above conventional technical problems, and is to provide an easy-to-manufacture organic-inorganic hybrid photoelectric conversion element having high photoelectric conversion efficiency and excellent durability. Another purpose of the present invention is to provide a method for easily manufacturing an organic-inorganic hybrid photoelectric conversion element having high photoelectric conversion efficiency and excellent durability.

The present inventors have researched extensively in order to achieve the above objectives and have found out that use of a compound with a specific structure among various hole transport materials allows for high photoelectric conversion efficiency. This compound is a compound with a specific butadiene structure as described below, is easy to synthesize, and is excellent in solubility into a solvent. A technology for mass production of the compound as a material used for an electrophotographic photoreceptor has already been established. This can realize high photoelectric conversion efficiency and, at the same time, enables an enlarged solar cell to be produced at low cost and in a large quantity.

Specifically, a photoelectric conversion element according to an embodiment of the present invention comprises a first conductive layer and a second conductive layer, and further comprises, in sequence, a closely packed titanium oxide layer, a porous titanium oxide layer, an organic-inorganic hybrid crystal layer, and a hole transport layer between the first conductive layer and the second conductive layer, wherein the hole transport layer comprises a compound with the following structure (I):

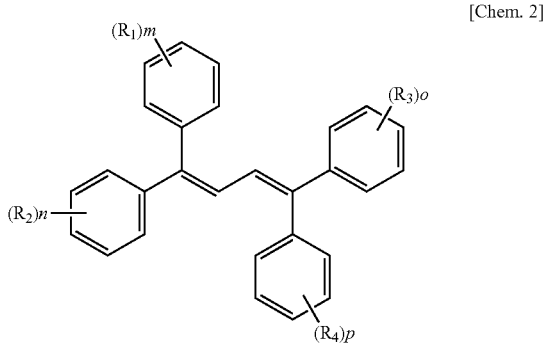

[Chem. 2]

where $R_1$ to $R_4$ are each the same or different and represent hydrogen atom, substituted or unsubstituted alkyl group, substituted or unsubstituted alkylamino group, substituted or unsubstituted arylamino group, or substituted or unsubstituted alkoxy group, provided that a case in which all of the $R_1$ to $R_4$ are hydrogen atom is excluded; and m, n, o, and p are each the same or different and represent an integer of 1 to 5, provided that when any of the m, n, o, and p is an integer of 2 or more, the corresponding R groups may each be the same or different.

In a photoelectric conversion element according to a preferable embodiment of the present invention, $R_1$ and $R_2$ are -p-N-$Et_2$ and $R_3$ and $R_4$ are hydrogen atom in the above structure (I).

In a photoelectric conversion element according to another preferable embodiment of the present invention, the organic-inorganic hybrid crystal layer comprises a perovskite-type crystal represented by $CH_3NH_3PbX_3$ where X is a halogen atom.

According to the above preferable embodiment of the present invention, in the formula $CH_3NH_3PbX_3$ representing the perovskite-type crystal, the X is an iodine atom.

A method for manufacturing the above photoelectric conversion element according to the present invention comprises a step of forming the hole transport layer, the step comprising: dissolving a compound with the structure (I) into an organic solvent to prepare coating liquid; coating the organic-inorganic hybrid crystal layer with the coating liquid; and then removing the organic solvent.

An aspect of the present invention can provide an easy-to-manufacture organic-inorganic hybrid photoelectric conversion element having high photoelectric conversion efficiency and excellent durability.

Another aspect of the present invention can provide a method for easily manufacturing an organic-inorganic hybrid photoelectric conversion element having high photoelectric conversion efficiency and excellent durability.

BRIEF DESCRIPTION OF THE DRAWINGS

FIG. 1 is a cross-sectional view schematically illustrating a photoelectric conversion element according to an embodiment of the present invention.

FIG. 2 is a schematic illustration of the unit lattice of a perovskite-type crystal structure.

DESCRIPTION OF THE PREFERRED EMBODIMENTS

Hereinafter, with reference to FIG. 1, a photoelectric conversion element and a method for manufacturing the photoelectric conversion element according to the present invention will be described in detail. FIG. 1 is a cross-sectional view schematically illustrating a photoelectric conversion element according to a first embodiment of the present invention. The photoelectric conversion element 1 shown in FIG. 1 comprises a first conductive layer 3, which is a cathode, and a second conductive layer 8, which is an anode, and further comprises a closely packed titanium oxide layer 4, a porous titanium oxide layer 5, an organic-inorganic hybrid crystal layer 6, and a hole transport layer 7 between the first conductive layer 3 and the second conductive layer 8. In the photoelectric conversion element 1 shown in FIG. 1, the organic-inorganic hybrid crystal layer 6 is a photoelectric conversion layer. Thus, the photoelectric conversion element 1 can also be called an organic-inorganic hybrid photoelectric conversion element.

The photoelectric conversion element according to the embodiment should comprises a closely packed titanium oxide layer, a porous titanium oxide layer, an organic-inorganic hybrid crystal layer, and a hole transport layer between the first conductive layer and the second conductive layer. The closely packed titanium oxide layer, the porous titanium oxide layer, the organic-inorganic hybrid crystal layer, and the hole transport layer are preferably stacked in this order on the first conductive layer that is a cathode. Specifically, in a preferable embodiment as shown in the photoelectric conversion element 1, the closely packed titanium oxide layer 4 is formed on the first conductive layer 3; the porous titanium oxide layer 5 is formed on the closely packed titanium oxide layer 4; the organic-inorganic hybrid crystal layer 6 is formed on the porous titanium oxide layer 5; the hole transport layer 7 is formed on the organic-inorganic hybrid crystal layer 6; and the second conductive layer 8 is formed on the hole transport layer 7.

The photoelectric conversion element according to the embodiment may be further provided with a substrate 2 as shown in FIG. 1. In this case, the first conductive layer 3 is preferably formed on the substrate 2. Note that when the substrate 2 side is irradiated with light as illustrated in FIG. 1, it is preferable to employ a transparent substrate as the substrate 2 and a transparent electrode as the first conductive layer 3. However, when the second conductive layer 8 side is irradiated with light, it is preferable to employ a transparent electrode as the second conductive layer 8. Meanwhile, both the first conductive layer 3 and the second conductive layer 8 may be transparent electrodes.

1. First Conductive Layer

The first conductive layer can serve as a cathode of the photoelectric conversion element. Examples of a cathode material that can be used for the first conductive layer include: conductive transparent materials (e.g., copper iodide (CuI), indium tin oxide (ITO), tin oxide ($SnO_2$), fluorine-doped tin oxide (FTO), aluminum-doped zinc oxide (AZO), indium zinc oxide (IZO), gallium-doped zinc oxide (GZO)); and sodium, sodium-potassium alloy, lithium, magnesium, aluminum, a magnesium-silver mixture, a magnesium-indium mixture, aluminum-lithium alloy, an aluminum-aluminum oxide ($Al/Al_2O_3$) mixture, and an aluminum-lithium fluoride (Al/LiF) mixture. These materials may be used singly or may be used in combination.

The first conductive layer can be produced by using a common process such as vapor deposition to deposit, on a substrate, a film made of a cathode material. Examples of the substrate for the photoelectric conversion element according to the present invention include, but are not particularly limited to, transparent glass substrates (e.g., a soda lime glass substrate, an alkali-free glass substrate), ceramic substrates, and transparent plastics. Commercially available products are applicable.

Preferably, the first conductive layer has a film thickness of from 0.4 to 1.5 μm. When the film thickness of the conductive layer is less than 0.4 μm, sufficient electrical conductivity is unlikely to be obtained. When the film thickness of the conductive layer exceeds 1.5 μm, its light transmittance is low and the photoelectric conversion efficiency is likely to decrease.

2. Closely Packed Titanium Oxide Layer

The closely packed titanium oxide layer, together with the below-described porous titanium oxide layer, provides an electron acceptor layer. This closely packed titanium oxide layer can exert an effect of preventing the first and second conductive layers from being in contact with each other, which contact causes a decrease in electromotive force. As used herein, the term "closely packed layer" means a poreless layer into which when a photoelectric conversion material is stacked thereon, the photoelectric conversion material does not penetrate. The term "porous layer" means a layer having large pores, so that the photoelectric conversion material can penetrate and an effect of enlarging the surface area of the material can be exerted.

The closely packed titanium oxide layer has a thickness of preferably from 5 to 200 nm and more preferably from 10 to 100 nm.

For example, the possible method for forming the closely packed titanium oxide layer includes the steps of: preparing coating liquid containing a titanium chelate compound; coating the first conductive layer with the coating liquid by using a film formation process such as spin coating, screen printing, a spray pyrolysis process, and aerosol deposition; and then subjecting to calcination. In addition, the formation of the closely packed titanium oxide layer is followed by soaking the closely packed titanium oxide layer in a titanium tetrachloride aqueous solution. This can make the closely packed titanium oxide layer denser and tighter.

As a titanium chelate compound that can be used to form the closely packed titanium oxide layer, commercially available products such as a TYZOR (a registered trademark) AA series, manufacture by DuPont Inc., may be used. Preferable examples include compounds with an acetoacetic ester chelate group and compounds with a β-diketone chelate group.

Among the titanium chelate compounds that can be used to form the closely packed titanium oxide layer, examples of the compounds with an acetoacetic ester chelate group include, but are not limited to, the following: diisopropoxy titanium bis(methylacetoacetate); diisopropoxy titanium bis(ethylacetoacetate); diisopropoxy titanium bis(propylacetoacetate); diisopropoxy titanium bis(butylacetoacetate); dibutoxy titanium bis(methylacetoacetate); dibutoxy titanium bis(ethylacetoacetate); triisopropoxy titanium (methylacetoacetate); triisopropoxy titanium (ethylacetoacetate); tributoxy titanium (methylacetoacetate); tributoxy titanium (ethylacetoacetate); isopropoxy titanium tri(methylacetoacetate); isopropoxy titanium tri(ethylacetoacetate); isobutoxy titanium tri(methylacetoacetate); and isobutoxy titanium tri(ethylacetoacetate). Examples of the compounds with a β-diketone chelate group include, but are not limited to, the following: diisopropoxy titanium bis(acetylacetonate); diisopropoxy titanium bis(2,4-heptanedionate); dibutoxy titanium bis(acetylacetonate); dibutoxy titanium bis(2,4-heptanedionate); triisopropoxy titanium (acetylacetonate); triisopropoxy titanium (2,4-heptanedionate); tributoxy titanium (acetylacetonate); tributoxy titanium (2,4-heptanedionate); isopropoxy titanium tri(acetylacetonate); isopropoxy titanium tri(2,4-heptanedionate); isobutoxy titanium tri(acetylacetonate); and isobutoxy titanium tri(2,4-heptanedionate).

3. Porous Titanium Oxide Layer

The porous titanium oxide layer, together with the closely packed titanium oxide layer, provides the electron acceptor layer. Incorporation of organic-inorganic hybrid crystals and a hole transport agent into pores of the porous layer causes the surface area of the interface between the organic-inorganic hybrid crystal layer and the hole transport layer to increase, thereby effectively increasing the amount of electrons generated.

The porous titanium oxide layer has a thickness of preferably from 100 to 20000 nm and more preferably from 200 to 1500 nm.

For example, the possible method for forming the porous titanium oxide layer includes the steps of: preparing coating liquid containing titanium oxide particles; coating the closely packed titanium oxide layer with the coating liquid by using a film formation process such as spin coating, screen printing, a spray pyrolysis process, and aerosol deposition; and then subjecting to calcination. Meanwhile, when the coating liquid contains an organic binder, the organic binder should be decomposed by the calcination.

Titanium oxide has several crystal forms. For the formation of the porous titanium oxide layer, anatase-type titanium oxide particles are preferably used.

For example, the coating liquid used for the formation of the porous titanium oxide layer can be prepared by dispersing titanium oxide particles (e.g., P-25, manufactured by NIPPON AEROSIL, Inc.) into alcohol (e.g., ethanol) or by diluting a titanium oxide paste (e.g., PST-18NR, manufactured by JGC C&C) with alcohol (e.g., ethanol).

Examples of the preferable organic binder that can be used for the above coating liquid include, but are not particularly limited to, ethyl cellulose and acrylic resins. Acrylic resins can be easily decomposed at lower temperatures and are thus particularly preferable because calcination at lower temperatures causes a little amount of the organic residue. The preferable acrylic resins are decomposed at low temperatures of about 300° C. Examples of the preferable acrylic resins used include polymers produced by polymerizing at least one (meth)acrylate monomer selected from the group consisting of methyl(meth)acrylate, ethyl(meth)acrylate, propyl(meth)acrylate, n-butyl(meth)acrylate, tert-butyl (meth)acrylate, isobutyl(meth)acrylate, cyclohexyl(meth) acrylate, 2-ethylhexyl(meth)acrylate, isobornyl(meth) acrylate, n-stearyl(meth)acrylate, benzyl(meth)acrylate, and (meth)acrylate monomers with a polyoxyalkylene structure.

The pore size of the porous titanium oxide layer may be adjusted by modifying the particle size of the titanium oxide particles and/or by changing the type and/or additive amount of the organic binder.

4. Organic-inorganic Hybrid Crystal Layer

The organic-inorganic hybrid crystal layer provides a photoelectric conversion layer containing organic-inorganic hybrid crystals and absorbs light to generate electrons. The organic-inorganic hybrid crystal layer possesses characteristics derived from the inorganic material and thus exhibits higher durability than a photoelectric conversion layer consisting of an organic material. Preferably, the organic-inorganic hybrid crystal layer is a layer composed of perovskite-type crystals. The unit lattice of the perovskite-type crystal structure is depicted in FIG. 2.

As shown in FIG. 2, the perovskite-type crystal that can be used for the organic-inorganic hybrid crystal layer has a cubic unit lattice. The organic groups A sit at cube corner positions. The metal B sits at the body center position. The halogens X sit at face-centered positions of the cubic lattice having the metal B at the lattice center. The crystal is represented by a general formula: A-B-$X_3$.

In the general formula A-B—$X_3$, specific examples of the organic group A include methyl amine, ethyl amine, propyl amine, butyl amine, pentyl amine, hexyl amine, dimethyl amine, diethyl amine, dipropyl amine, dibutyl amine, dipentyl amine, dihexyl amine, trimethyl amine, triethyl amine, tripropyl amine, tributyl amine, tripentyl amine, trihexyl amine, ethylmethyl amine, methylpropyl amine, butylmethyl amine, methylpentyl amine, hexylmethyl amine, ethylpropyl amine, ethylbutyl amine, imidazole, azole, pyrrole, aziridine, azirine, azetidine, azete, azole, imidazoline, carbazole, and ions thereof (e.g., methyl ammonium ($CH_3NH_3$)), and phenethyl ammonium. Among them, preferred are methyl amine, ethyl amine, propyl amine, butyl amine, pentyl amine, hexyl amine, and ions thereof, and phenethyl ammonium. More preferred are methyl amine, ethyl amine, propyl amine, and ions thereof (e.g., methyl ammonium ($CH_3NH_3$)).

In the general formula A-B—$X_3$, specific examples of the metal B include lead, tin, zinc, titanium, antimony, bismuth, nickel, iron, cobalt, silver, copper, gallium, germanium, magnesium, calcium, indium, aluminum, manganese, chromium, molybdenum, and europium. If the metal B is lead among them, the organic-inorganic hybrid crystal layer has good characteristics. Note that these elements may be used singly or may be used in combination.

In the general formula A-B—$X_3$, the halogen X may be chlorine, bromine, or iodine. These elements may be used singly or in combination. Because the energy band gap can be small, at least one of Xs is preferably iodine among the above elements.

In the photoelectric conversion element according to the embodiment, the organic-inorganic hybrid crystal layer is preferably a layer composed of a perovskite-type crystal represented by $CH_3NH_3PbX_3$ where X is a halogen atom. In the formula $CH_3NH_3PbX_3$ representing the perovskite-type crystal, it is more preferable that the X is an iodine atom.

The perovskite-type crystals that can be used for the organic-inorganic hybrid crystal layer may be synthesized using AX and $BX_2$ as starting materials. Specifically, a one-step method comprises a step of mixing, heating, and stirring an AX solution and a $BX_2$ solution to synthesize a perovskite-type crystal. A two-step method comprises: a step of coating, for example, a porous titanium oxide layer with a $BX_2$ solution to form a coating film; and a step of coating the coating film with an AX solution to make $BX_2$ and AX react, thereby synthesizing a perovskite-type crystal. These known methods can be used for the formation of the organic-inorganic hybrid crystal layer. Examples of the coating process include, but are not particularly limited to, spin coating, screen printing, and dip coating.

5. Hole Transport Layer

The hole transport layer transports holes generated in the organic-inorganic hybrid crystal layer to the second conductive layer, which is an anode. In the photoelectric conversion element according to the embodiment, the hole transport layer comprises a compound represented by the following structure (I):

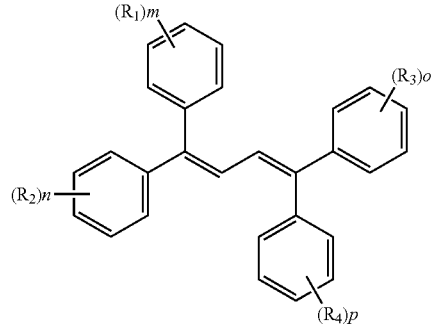

[Chem. 4]

where $R_1$ to $R_4$ are each the same or different and represent hydrogen atom, substituted or unsubstituted alkyl group, substituted or unsubstituted alkylamino group, substituted or unsubstituted arylamino group, or substituted or unsubstituted alkoxy group, provided that a case in which all of the $R_1$ to $R_4$ are hydrogen atom is excluded; and m, n, o, and p are each the same or different and represent an integer of 1 to 5, provided that when any of the m, n, o, and p is an integer of 2 or more, the corresponding R groups may each be the same or different. Use of the compound with the above structure (I) as a hole transport material allows for high photoelectric conversion efficiency.

In the above structure (I), $R_1$ to $R_4$ are each the same or different and represent hydrogen atom, substituted or unsubstituted alkyl group, substituted or unsubstituted alkylamino group, substituted or unsubstituted arylamino group, or substituted or unsubstituted alkoxy group. Here, a case in which all of the $R_1$ to $R_4$ are hydrogen atom is excluded. Examples of the substituted or unsubstituted alkyl group include methyl (Me) and ethyl (Et). Examples of the substituted or unsubstituted alkylamino group include dimethyl amino group ($NMe_2$), diethyl amino group ($NEt_2$), and dipropyl amino group ($NPr_2$). Examples of the substituted or unsubstituted arylamino group include dibenzyl amino group ($NBenzyl_2$). Examples of the substituted or unsubstituted alkoxy group include methoxy group (OMe).

In the above structure (I), m, n, o, and p are each the same or different and represent an integer of 1 to 5. Here, when any of the m, n, o, and p is an integer of 2 or more, the corresponding R groups may each be the same or different. For example, when m is 2, there are two $R_1$s, which are the corresponding R groups, in the above structure (I). These $R_1$s may be the same or different. Preferably, all of the m, n, o, and p are 1.

Table 1 shows specific examples of the compound with the structure (I), including exemplary compounds 1 to 13. Note that in Table 1, the sign "p" indicates that when the position of the benzene ring carbon atom attached to a butadiene structure is set to position 1, a substituent R is attached to the carbon atom at position 4 of the benzene ring.

TABLE 1

| No. | R1 | R2 | R3 | R4 |
|-----|------|------|------|------|
| 1 | -p-NEt2 | -p-NEt2 | —H | —H |
| 2 | -p-NBenzyl2 | -p-NMe2 | —H | —H |
| 3 | -p-NBenzyl2 | -p-NEt2 | —H | —H |
| 4 | -p-NBenzyl2 | -p-NPr2 | —H | —H |
| 5 | -p-NEt2 | —H | -p-Me | -p-Me |
| 6 | -p-NEt2 | —H | —H | —H |
| 7 | -p-NMe2 | -p-NMe2 | —H | —H |

TABLE 1-continued

| No. | R1 | R2 | R3 | R4 |
|---|---|---|---|---|
| 8 | -p-NMe2 | —H | —H | —H |
| 9 | -p-NMe2 | —H | -p-Me | -p-Me |
| 10 | -p-NPr2 | -p-NPr2 | —H | —H |
| 11 | -p-NPr2 | —H | —H | —H |
| 12 | -p-NEt2 | -p-NEt2 | -p-OMe | -p-OMe |
| 13 | -p-NEt2 | -p-NEt2 | -p-Et | -p-Et |

In the photoelectric conversion element according to a preferable embodiment, the compound has the above structure (I), wherein $R_1$ and $R_2$ are -p-N-Et$_2$ and $R_3$ and $R_4$ are hydrogen atom. Among the exemplary compounds shown in Table 1, the exemplary compound 1 is particularly preferable.

The compound with the above structure (I) can be synthesized in accordance with a process disclosed in, for examples, JP62-30255A, but commercially available ones are applicable.

The hole transport layer can be formed by dissolving a compound with the structure (I) into an organic solvent (e.g., chlorobenzene) to prepare coating liquid; by coating an organic-inorganic hybrid crystal layer with the coating liquid; and then by removing the organic solvent. Examples of the coating process include, but are not particularly limited to, spin coating, screen printing, and dip coating. The method for manufacturing a photoelectric conversion element of the present invention comprises a step of forming such a hole transport layer. Accordingly, an organic-inorganic hybrid photoelectric conversion element having high photoelectric conversion efficiency and excellent durability can be easily manufactured. Hence, the method is applicable to the manufacture of a large-size solar photoelectric conversion system. Further, the method for manufacturing a photoelectric conversion element according to the present invention can use low-cost materials, so that the cost can be reduced.

The hole transport layer has a thickness of preferably from 20 to 500 nm and more preferably from 50 to 150 nm. Meanwhile, compounds with the above structure (I) are not susceptible to crystallization. In order to reliably prevent the compounds with the above structure (I) from being subject to crystallization, the hole transport layer may contain, for example, an organic binder resin and/or a plasticizer.

6. Second Conductive Layer

The second conductive layer can serve as an anode of the photoelectric conversion element. Anode materials that can be used for the second conductive layer are not particularly limited, and conventionally known materials may be used. Examples include metals (e.g., gold, silver, platinum), conductive transparent materials (e.g., copper iodide (CuI), indium tin oxide (ITO), tin oxide ($SnO_2$), fluorine-doped tin oxide (FTO), aluminum-doped zinc oxide (AZO), indium zinc oxide (IZO), gallium-doped zinc oxide (GZO)), and conductive transparent polymers. These materials may be used singly or may be used in combination.

The second conductive layer can be produced by using a common process such as vapor deposition to deposit, on the hole transport layer, a film made of an anode material. In the case of a gold electrode, the second conductive layer has a film thickness of preferably from 50 to 100 nm.

EXAMPLES

Hereinafter, the present invention will be further described in detail by referring to Examples. The present invention, however, is not limited to the following Examples.

Example 1

1. First Conductive Layer

First, a glass substrate (at a thickness of 2.2 mm) was subjected to vapor deposition to form a fluorine-doped $SnO_2$ conductive film. Next, the prepared glass substrate was cut into pieces with a size of 25 mm×25 mm. Then, the pieces were subjected to ultrasonic cleaning for 1 hour, followed by UV irradiation for 30 min.

2. Closely Packed Titanium Oxide Layer

First, a 1-butanol solution containing 75% by mass of diisopropoxy titanium bis(acetylacetonate) (titanium (IV) bis(acetylacetonate) diisopropoxide) (manufactured by Sigma-Aldrich Inc.) was diluted with 1-butanol to prepare a solution (coating liquid) for a closely packed titanium oxide layer. The solution has a concentration of a titanium chelate compound of 0.02 mol/L. Next, spin coating was used to coat the first conductive layer produced in the above "1. First conductive layer" with the above solution for a closely packed titanium oxide layer. Then, the resulting coating layer was heated at 450° C. for 15 min to produce a closely packed titanium oxide layer at a film thickness of 50 nm.

3. Porous Titanium Oxide Layer

First, 1 g of titanium oxide-containing ethanol dispersion (PST-18NR, manufactured by JGC C&C) was diluted with 2.5 g of ethanol to prepare coating liquid for a porous titanium oxide layer. Next, spin coating was used to coat the closely packed titanium oxide layer produced in the above "2. Closely Packed Titanium Oxide Layer" with the above coating liquid for a porous titanium oxide layer. Then, the resulting stack was subjected to calcination to produce a porous titanium oxide layer at a film thickness of 300 nm. The calcination was carried out at 450° C. for 1 hour.

4. Organic-inorganic Hybrid Layer

First, 1.4 g of $PbCl_2$ (manufactured by TOKYO CHEMICAL INDUSTRY CO., LTD.) was heated and dissolved into 3 ml of N,N-dimethylformamide (DMF) to prepare coating liquid. Next, spin coating was used to coat the porous titanium oxide layer produced in the above "3. Porous Titanium Oxide Layer" with this coating liquid to produce a coating film. The color of this coating film was the same as that of the coating liquid and was yellow.

Then, 0.4 g of $CH_3NH_3I$ (manufactured by Wako Pure Chemical Industries, Ltd.) was dissolved into 40 ml of isopropyl alcohol. After that, a beaker was filled with the resulting solution. The glass plate provided with the $PbCl_2$-containing coating film as so produced was dipped into the $CH_3NH_3I$ solution. The color of the coating film immediately changed from yellow to black. This verified the formation of a perovskite-type crystal represented by $CH_3NH_3PbI_3$. In this way, a two-step method was used to form an organic-inorganic hybrid layer.

5. Hole Transport Layer

First, 60 mg of a hole transport agent, which was the exemplary compound 1 (i.e., T-405, manufactured by Takasago International Corporation) represented in Table 1 by the following formula:

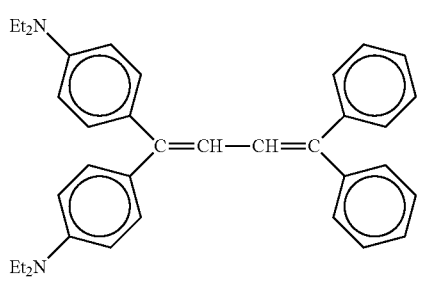

[Chem. 5]

was dissolved into 2 ml of chlorobenzene to prepare a solution (coating liquid) for a hole transport layer. Next, spin coating was used to coat the organic-inorganic hybrid layer produced in the above "4. Organic-inorganic Hybrid Layer" with this solution. Then, the resulting coating film was heated and dried, so that the organic solvent was removed. Subsequently, a hole transport layer at a film thickness of 100 nm was formed.

6. Second Conductive Layer

The hole transport layer produced in the above "5. Hole Transport Layer" was subjected to vacuum deposition to form, as an anode, a gold vapor deposition film with a size of 5 mm (length)×5 mm (width)×100 nm (thickness). Finally, an organic-inorganic hybrid photoelectric conversion element of Example 1 was manufactured.

7. Measurement of Photoelectric Conversion Efficiency

In the organic-inorganic hybrid photoelectric conversion element as so manufactured, the gold vapor deposition film was used as an anode and the FTO vapor deposition film was used as a cathode. The photoelectromotive force and photoelectric conversion current therebetween were measured using a white light source (COLD LIGHT HL150, manufactured by HOYA-SCHOTT Inc.) at a light intensity of 25 mW/cm$^2$. Then, the photoelectric conversion efficiency of the organic-inorganic hybrid photoelectric conversion element was determined. The results demonstrated photoelectric conversion efficiency of 10.1%.

Example 2

The same procedure as that of Example 1 was carried out except that the exemplary compound 3 was used instead of the exemplary compound 1. Then, an organic-inorganic hybrid photoelectric conversion element of Example 2 was obtained. The photoelectric conversion efficiency was 8.4%.

Example 3

The same procedure as that of Example 1 was carried out except that the exemplary compound 4 was used instead of the exemplary compound 1. Then, an organic-inorganic hybrid photoelectric conversion element of Example 3 was obtained. The photoelectric conversion efficiency was 8.6%.

Comparative Example 1

The same procedure as that of Example 1 was carried out except that the hole transport layer was produced in the following manner. Then, an organic-inorganic hybrid photoelectric conversion element of Comparative Example 1 was obtained. The photoelectric conversion efficiency was 7.4%.

First, 144 mg of spiro-OMeTAD (manufactured by Luminescence Technology Inc.) as a hole transport agent, 18 mg of lithium bis(trifluoromethane sulfonyl)imido (manufactured by Kishida Chemical Co., Ltd.) as an ion conductive agent, and 53 mg of 4-tert-butylpyridine (manufactured by TOKYO CHEMICAL INDUSTRY CO., LTD.) were dissolved into 2 ml of chlorobenzene (manufactured by Kishida Chemical Co., Ltd.) to prepare coating liquid for a hole transport layer. In order to oxidize the spiro-OMeTAD, the coating liquid for a hole transport layer was left in the air for one day. Next, spin coating was used to coat the organic-inorganic hybrid layer with the coating liquid for a hole transport layer. Then, the resulting coating film was heated and dried, so that the organic solvent was removed. Subsequently, a hole transport layer at a film thickness of 100 nm was formed.

Comparative Example 2

The same procedure as that of Example 1 was carried out except that a hole transport material with the following structure:

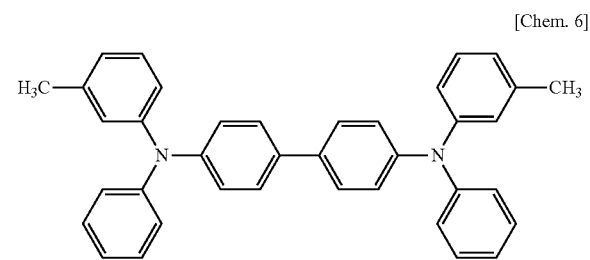

[Chem. 6]

was used instead of the exemplary compound 1. Then, an organic-inorganic hybrid photoelectric conversion element of Comparative Example 2 was obtained. Note that the photoelectric conversion efficiency of the organic-inorganic hybrid photoelectric conversion element of Comparative Example 2 was unable to be measured because the hole transport material was crystallized after the application of the coating liquid for a hole transport layer.

INDUSTRIAL APPLICABILITY

The photoelectric conversion element according to the present invention is applicable to solar cells. In addition, an easy-to-manufacture organic-inorganic hybrid photoelectric conversion element having high photoelectric conversion efficiency and excellent durability can be provided. Hence, the photoelectric conversion element is applicable to large-size solar (mega solar) photoelectric conversion systems and/or compact portable devices.

EXPLANATION OF REFERENCE NUMERALS

1 Photoelectric conversion element
2 Substrate
3 First conductive layer
4 Closely packed titanium oxide layer
5 Porous titanium oxide layer
6 Organic-inorganic hybrid crystal layer
7 Hole transport layer
8 Second conductive layer

What is claimed is:
1. A photoelectric conversion element comprising a first conductive layer and a second conductive layer, and further comprising, in sequence, a closely packed titanium oxide layer, a porous titanium oxide layer, an organic-inorganic hybrid crystal layer, and a hole transport layer between the first conductive layer and the second conductive layer, wherein the hole transport layer consists of a compound with the following structure (I):

[Chem. 1]

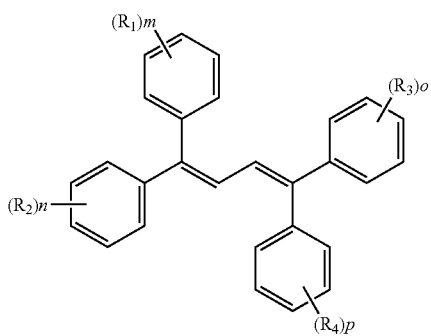

where $R_1$ to $R_4$ are each the same or different and represent hydrogen atom, substituted or unsubstituted alkyl group, substituted or unsubstituted alkylamino group, substituted or unsubstituted arylamino group, or substituted or unsubstituted alkoxy group, provided that a case in which all of the $R_1$ to $R_4$ are hydrogen atom is excluded; and m, n, o, and p are each the same or different and represent an integer of 1 to 5, provided that when any of the m, n, o, and p is an integer of 2 or more, the corresponding R groups may each be the same or different.

2. The photoelectric conversion element according to claim 1, wherein $R_1$ and $R_2$ are each a diethyl amino group attached to the para position of a phenyl group and $R_3$ and $R_4$ are hydrogen atom in the structure (I).

3. The photoelectric conversion element according to claim 1, wherein the organic-inorganic hybrid crystal layer comprises a perovskite-type crystal represented by $CH_3NH_3PbX_3$ where X is a halogen atom.

4. The photoelectric conversion element according to claim 3, wherein in the formula $CH_3NH_3PbX_3$ representing the perovskite-type crystal, the X is an iodine atom.

5. A method for manufacturing the photoelectric conversion element according to claim 1, comprising a step of forming the hole transport layer, the step comprising:
dissolving a compound with the structure (I) into an organic solvent to prepare coating liquid;
coating the organic-inorganic hybrid crystal layer with the coating liquid; and then
removing the organic solvent.

6. The photoelectric conversion element according to claim 2, wherein the organic-inorganic hybrid crystal layer comprises a perovskite-type crystal represented by $CH_3NH_3PbX_3$ where X is a halogen atom.

7. A method for manufacturing the photoelectric conversion element according to claim 2, comprising a step of forming the hole transport layer, the step comprising:
dissolving a compound with the structure (I) into an organic solvent to prepare coating liquid;
coating the organic-inorganic hybrid crystal layer with the coating liquid; and then
removing the organic solvent.

8. A method for manufacturing the photoelectric conversion element according to claim 3, comprising a step of forming the hole transport layer, the step comprising:
dissolving a compound with the structure (I) into an organic solvent to prepare coating liquid;
coating the organic-inorganic hybrid crystal layer with the coating liquid; and then
removing the organic solvent.

9. A method for manufacturing the photoelectric conversion element according to claim 4, comprising a step of forming the hole transport layer, the step comprising:
dissolving a compound with the structure (I) into an organic solvent to prepare coating liquid;
coating the organic-inorganic hybrid crystal layer with the coating liquid; and then
removing the organic solvent.

10. The photoelectric conversion element according to claim 1, wherein a thickness of the hole transport layer is in the range of 20 to 150 nm.

* * * * *